United States Patent
Funabashi et al.

(10) Patent No.: US 7,541,773 B2
(45) Date of Patent: Jun. 2, 2009

(54) BATTERY-POWERED TOOL CAPABLE OF DETECTING DISCHARGED BATTERY PACK

(75) Inventors: Kazuhiko Funabashi, Hitachinaka (JP); Nobuhiro Takano, Hitachinaka (JP); Chikai Yoshimizu, Hitachinaka (JP); Katsuhiro Oomori, Hitachinaka (JP); Yoshihiro Komuro, Hitachinaka (JP)

(73) Assignee: Hitachi Koki Co., Ltd., Tokyo (JP)

( * ) Notice: Subject to any disclaimer, the term of this patent is extended or adjusted under 35 U.S.C. 154(b) by 685 days.

(21) Appl. No.: 11/071,321

(22) Filed: Mar. 4, 2005

(65) Prior Publication Data

US 2005/0194929 A1 Sep. 8, 2005

(30) Foreign Application Priority Data

Mar. 5, 2004 (JP) ............................ P2004-061936

(51) Int. Cl.
*H02J 7/00* (2006.01)
(52) U.S. Cl. ...................................... 320/114; 320/112
(58) Field of Classification Search ................. 320/112, 320/114, 134
See application file for complete search history.

(56) References Cited

U.S. PATENT DOCUMENTS

2003/0096158 A1* 5/2003 Takano et al. ................ 429/90

FOREIGN PATENT DOCUMENTS

| EP | 0 653 826 | | 5/1995 |
| JP | 404200244 A | * | 7/1992 |
| JP | 5-203684 | | 8/1993 |
| JP | 11-198062 | | 7/1999 |

* cited by examiner

*Primary Examiner*—Akm E Ullah
*Assistant Examiner*—Samuel Berhanu
(74) *Attorney, Agent, or Firm*—Antonelli, Terry, Stout & Kraus, LLP.

(57) ABSTRACT

In order to prevent a battery pack from being overly discharged during use in a power tool, a discharge voltage limit circuit is provided. The circuit disconnects the battery pack from the motor when the voltage of the battery pack falls below a predetermined level. However, the circuit is operable only when the main switch is OFF, that is, when no load is imposed on the motor.

13 Claims, 5 Drawing Sheets

BATTERY-POWERED TOOL CAPABLE OF DETECTING DISCHARGED BATTERY PACK

BACKGROUND OF THE INVENTION

1. Field of the Invention

The present invention relates to a cordless power tool using a battery pack as a power source.

2. Description of the Related Art

Battery-powered tools, such as impact drivers, drills, drivers, or circular saws, have been extensively used because they are easy to use and no power source cables are required. To increase the usability of such tools, various functions are required to be added. A discharge voltage limiter (hereinafter referred to as "DVL") function is one of the functions required for the battery-powered tools. The DVL function is for controlling the battery pack so as to halt discharging when the battery voltage has dropped to a predetermined voltage.

The battery pack with little charges remaining as a result of continuous use can be reused if the use of the battery pack is halted for a certain period of time to wait for recovery of the battery voltage. Because the recovered battery pack has a power to tighten further several screws, the tool is frequently used in such a manner. However, if this is done, the battery pack is discharged to a deeper level. Cells making up the battery pack are liable to be damaged if they are fully discharged. To prolong the lifetime (repetitive use number) of the battery pack, it is desirable to recharge the battery pack before it reaches a full discharge condition.

One of the cells of the battery pack is liable to be short-circuited or malfunctioned, or the internal resistance of the cell is abnormally increased when the battery pack is repetitively used a number of times. The use of such battery pack remarkably lowers the rotational speed of a motor of the tool. Operation of the tool, particularly an impact driver in which tightening torque is proportional to the rotational speed of the motor, cannot be performed properly with such a defective battery pack.

The DVL function is required in order to dissolve the above-described problems. Japanese Patent Application Publication No. 5-123975 proposes a DVL function but is involved with the following problems.

Driving the tool lowers the battery voltage due to various resistances distributed over the current flowing path. There exist resistances in a main switch, contact portions between the battery pack and tool, each cell of the battery pack having an internal resistance, and connection plates interposed between the cells. However, in the DVL function according to the conventional art, the fact that the battery voltage is greatly lowered at the time of start-up of the motor is not taken into consideration. Further, the DVL is activated with respect to the battery packs having a residual amount of charges.

A load current differs depending upon whether a load imposed on the battery pack is heavy or not, so that there exist a difference in the level of the battery voltage lowered due to the circuit resistance. Nevertheless, because the limit voltage is fixed, the battery pack is deeply discharged in the case of light load whereas the battery pack is not so discharged in the case of heavy load. The fact that the limit voltage is fixed does not allow the battery pack to intentionally deeply discharge for the purpose of activating the battery pack.

Even if the DVL is once actuated, the battery voltage can recover if the battery pack is left unused for a certain period of time. Using the recovered voltage, it is possible to rotate the motor for a short period of time from the closure of the main switch to the actuation of the DVL. Small-size screws can be tightened using the residual power of the battery pack, however, the battery pack results in a deeply discharged condition.

With the conventional DVL technology in which the residual capacity of the battery pack is detected based on the battery voltage, a problem exists in that detection of the residual capacity of the battery pack cannot be performed with high accuracy.

SUMMARY OF THE INVENTION

In view of the foregoing, the present invention has been made to solve the above-described problems accompanying the conventional art, and accordingly it is an object of the invention to provide a battery-powered tool in which residual capacity of the battery pack can be detected with high accuracy.

To achieve the above and other objects, there is provided a battery-powered tool that includes a regulated power supply, a motor, a main switch, a switching element, a voltage comparison circuit, and a motor-operation detecting circuit. The regulated power supplies a fixed voltage. The motor is driven by a battery pack. The battery pack generates a voltage that changes depending on a residual amount of charges in the battery pack and a load imposed on the motor. The main switch is connected between the battery pack and the motor. The switching element is connected in series with the motor, the battery pack and the main switch. The voltage comparison circuit has a first input terminal applied with a detection voltage indicative of a voltage of the battery pack, a second input terminal applied with a reference voltage, and an output terminal. The voltage comparison circuit compares the detection voltage with the reference voltage and selectively outputs one of a first signal and a second signal to the first output terminal. The first signal is output when the detection voltage is above the reference voltage, and the second signal is output when the detection voltage falls below the reference voltage. The switching element is rendered ON in response to the first signal whereas the same is rendered OFF in response to the second signal. The motor-operation detecting circuit detects a driving status of the motor and outputs a third signal when the motor is driven and a fourth signal when the motor is not driven. The voltage comparison circuit does not output the second signal as far as the third signal is output from the motor-operation detecting circuit regardless of whether the detection voltage is above or falls below the reference voltage.

An alarm circuit may further be provided. The alarm circuit alerts a user that the voltage of the battery pack has been lowered in response to the second signal output from the voltage comparison circuit.

The voltage comparison circuit and the motor-operation detecting circuit can be configured so that the third signal invalidates the detection voltage and is applied to the first input terminal of the voltage comparison circuit, thereby causing the voltage comparison circuit to output the first signal regardless of whether the detection voltage is above or falls below the reference voltage.

In the above-described circuit configuration, the motor-operation detecting circuit may include a gate that allows the third signal to be applied to the first input terminal of the voltage comparison circuit and does not allow the fourth signal to be applied to the first input terminal of the voltage comparison circuit.

When the motor-operation detecting circuit outputs the fourth signal, the voltage comparison circuit selectively outputs one of the first signal and the second signal depending upon whether the detection voltage is above or falls below the reference voltage.

A self-holding circuit may further be provided to hold the second signal output from the voltage comparison circuit once the detection voltage falls below the reference voltage.

In another circuit configuration, the voltage comparison circuit may include an AND gate having one input terminal connected to the output terminal of the voltage comparison circuit and another input terminal connected to the output of the motor-operation detecting circuit. The AND gate is enabled and the second signal is allowed to pass therethrough and applied to the alarm circuit when the fourth signal is output from the motor-operation detection circuit.

According to another aspect of the invention, there is provided a battery-powered tool that includes a regulated. power supply that supplies a fixed voltage, a motor, a main switch, and a discharge voltage limit circuit. The motor is driven by a battery pack. The battery pack generates a voltage that changes depending on a residual amount of charges in the battery pack and a load imposed on the motor. The main switch is connected between the battery pack and the motor. The discharge voltage limit circuit is provided to disconnect the battery pack from the motor when the voltage of the battery pack falls below a predetermined level. However, the discharge voltage limit circuit is operable only when the main switch is OFF, that is, when no load is imposed on the motor.

It is preferable to provide a self-holding circuit that remains the battery pack disconnected from the motor once the discharge voltage limit circuit is operated.

BRIEF DESCRIPTION OF THE DRAWINGS

The particular features and advantages of the invention as well as other objects will become apparent from the following description taken in connection with the accompanying drawings, in which.

DETAILED DESCRIPTION OF THE PREFERRED EMBODIMENTS

Figure 1:
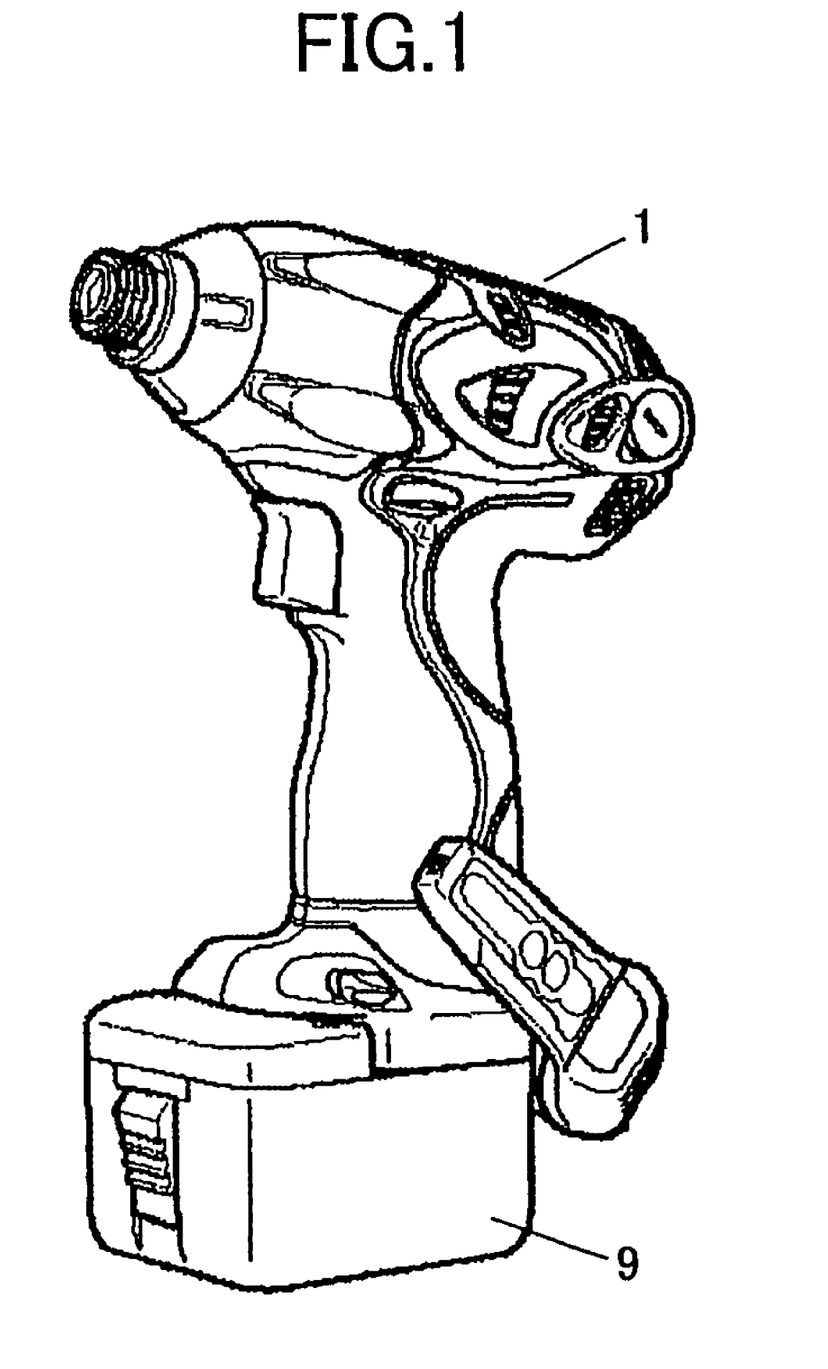
FIG. 1 is a perspective view showing the battery-powered tool according to the embodiment of the invention.
Figure 2:
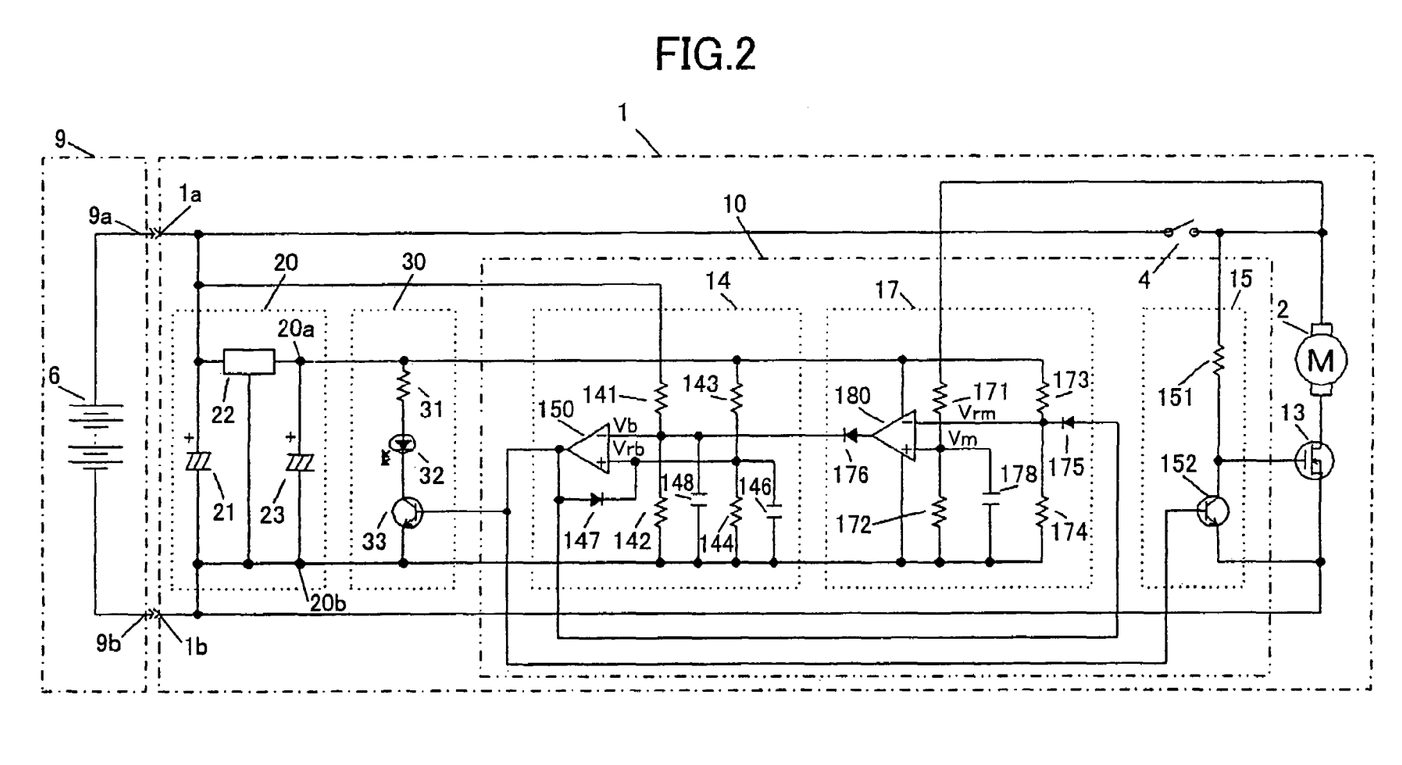
FIG. 2 is a circuit diagram showing a battery-powered tool according to one embodiment of the invention.

A battery-powered tool according to a preferred embodiment of the invention will be described while referring to FIGS. 2 through 4. FIG. 2 is a circuit diagram of a battery pack 9 and the battery-powered tool 1.

The battery pack 9 includes a plurality of cells 6 connected in series, a positive terminal 9a, and a negative terminal 9b. The battery-powered tool 1 includes a main loop circuit in which a positive terminal 1a, a main switch 4, a motor 2, an FET 13, and a negative terminal 1b are connected in series. The battery-powered tool 1 further includes a control circuit 10, a regulated power supply 20, and an alarm circuit 30.

The regulated power supply 20 is provided for operating the control circuit 10 in high precision. The regulated power supply 20 is connected across the positive and negative terminals 9a, 9b and includes capacitors 21, 23 and a regulator 22. The regulated power supply 20 implements a DC-to-DC conversion of the battery voltage to produce a regulated DC voltage having a fixed level. The output voltage from the regulated power supply 20 is held constant regardless of the change of the battery voltage. The output voltage from the regulated power supply 20 is developed across positive and negative output terminals 20a and 20b and is supplied to the control circuit 10 and the alarm circuit 30.

The control circuit 10 is provided for controlling the FET 13, and includes a voltage comparison circuit 14, a drive circuit 15, and a motor-operation detecting circuit 17. The voltage comparison circuit 14 generally produces status information about the output voltage of the battery pack 9 while referring to the driving status of the motor 12, as will be described far more in detail below. The drive circuit 15 controls the FET 13 to turn it ON or OFF in response to the output from the voltage comparison circuit 14. The motor-operation detecting circuit 17 detects that the motor 2 is being driven or stopped.

Specifically, the voltage comparison circuit 14 includes a first series-connection resistor circuit composed of resistors 141 and 142 that are connected in series across the positive and negative terminals 9a, 9b of the battery pack 9 through the positive and negative terminals 1a, 1b of the tool 1, respectively. A first capacitor 148 is connected across the resistor 142. The voltage comparison circuit 14 further includes a second series-connection resistor circuit composed of resistors 143 and 144 that are connected in series across the positive and negative output terminals 20a, 20b of the regulated power supply 20. A second capacitor 146 is connected across the resistor 144.

The voltage comparison circuit 14 further includes an operational amplifier 150 having inverting and non-inverting input terminals. Applied to the inverting input terminal is a voltage appearing at a point between the resistors 141 and 142. The voltage applied to the inverting input terminal of the operational amplifier 150 is thus indicative of the battery voltage and will hereinafter referred to as "battery voltage Vb". On the other hand, applied to the non-inverting input terminal of the operational amplifier 150 is a voltage appearing at a point between the resistors 143 and 144. The voltage applied to the non-inverting input terminal of the operational amplifier 150 is indicative of the output voltage of the regulated power supply 20 and will hereinafter referred to as "reference battery voltage Vrb". A diode 147 is connected between the output terminal and the non-inverting input terminal of the operational amplifier 150 in such a manner that the anode of the diode 147 is connected to the output terminal of the operational amplifier 150 and the cathode to the non-inverting input terminal.

The capacitor 146 serves to maintain the output of the operational amplifier 150 at a low level when the battery pack 9 is connected to the tool 1. The capacitor 148 serves to suppress abrupt lowering of the voltage impressed on the inverting input terminal of the operational amplifier 150, which occurs at the time of startup of the motor 2.

The diode 147 serves to maintain the output of the operational amplifier 150 at a high-level state, once the output of the operational amplifier 150 turns to a high-level from a low-level. Specifically, when the battery voltage Vb applied to the inverting input terminal of the operational amplifier 150 falls below the reference battery voltage Vrb applied to the non-inverting input terminal of the operational amplifier 150, the output of the operational amplifier 150 turns to the high level. In this condition, the diode 147 maintains the voltage impressed on the non-inverting input terminal to be substantially equal to the output voltage of the operational amplifier 150, that is, high level higher than the reference battery voltage Vrb. The output of the operational amplifier 150 is maintained at the high level even if the reference battery voltage Vb is later increased resulting from the voltage recovery of the battery pack 9.

The motor-operation detecting circuit 17 includes a first series-connection resistor circuit composed of resistors 171 and 172, a second series-connection resistor circuit composed of resistors 173 and 174, a capacitor 178 connected across the resistor 172, an operational amplifier 180, and diodes 175 and 176. The operational amplifier 180 operates as a voltage comparator. The first series-connection resistor circuit (171, 172) is connected across the motor 12, and the second series-connection resistor circuit (173, 174) across the regulated power supply 20. Of the first series-connection resistor circuit, the resistor 171 is connected to a point between the main switch 4 and the motor 12. The operational amplifier 180 has an inverting input terminal to which applied is a voltage appearing at a point between the resistors 173 and 174, which voltage will hereinafter referred to as "reference motor voltage Vrm". The non-inverting input terminal of the operational amplifier 180 is applied with a voltage appearing at a point between the resistors 171 and 172, which voltage will hereinafter referred to as "motor voltage Vm". The motor voltage Vm is thus indicative of a voltage at a point connecting the main switch 4 and the motor 12.

The diode 175 has an anode connected to the output of the operational amplifier 150 and a cathode connected to the inverting input terminal of the operational amplifier 180. With this configuration, the motor-operation detecting circuit 17 does not produce the high-level signal once the output of the voltage comparison circuit 14 turns to a high-level. More specifically, despite the fact that the battery voltage drop is once detected by the voltage comparison circuit 14 and the detected state is maintained by virtue of the diode 147 functioning as a self-holding means, the output of the motor-operation detecting circuit 17 does not reset the self-holding means 147.

The drive circuit 15 includes a resistor 151 and a transistor 152. The resistor 151 has one terminal connected to the main switch 4 and another terminal connected to both the collector of the transistor 152 and the gate of the FET 13. The base of the transistor 152 is connected to the output of the operational amplifier 150.

The alarm circuit 30 is provided for alerting the user that the voltage developed across the battery pack 9 has dropped. The alarm circuit 30 includes a resistor 31, an LED 32, and a transistor 33 that are connected in series across the positive and negative output terminals 20a and 20b of the. regulated power source 20.

In operation, the output of the operational amplifier 180 in the motor-operation detecting circuit 17 turns to a high level when the motor voltage Vm has exceeded the reference motor voltage Vrm. The high level signal output from the operational amplifier 180 is applied through the diode 176 to the inverting input terminal of the operational amplifier 150 of the voltage comparison circuit 14. The diode 176 serves to transmit only the high level signal to the voltage comparison circuit 14. Specifically, the motor-operation detecting circuit 17 outputs the high-level signal to the voltage comparison circuit 14 when the main switch 4 is ON and the motor 2 is being driven. This high-level signal is applied to the inverting input terminal of the operational amplifier 150. In this condition, the battery voltage Vb is invalidated by the high-level signal output from the motor-operation detecting circuit 17. This means that even if the actual battery voltage falls below the reference battery voltage Vrb during driving of the motor 2, the voltage comparison circuit 14 does not produce a high-level signal. The battery voltage drop detection is carried out when the main switch 4 is turned off and thus the motor 12 is not driven.

Turning off the main switch 4 renders the FET 13 OFF and thus driving of the motor 12 is stopped. In this condition, if the battery voltage Vb falls below the reference battery voltage Vrb, the operational amplifier 150 of the voltage comparison circuit 14 outputs a high-level signal. The transistor 152 of the drive circuit 15 is rendered ON in response to the high-level signal output from the operational amplifier 150. When the transistor 152 is rendered ON, the FET 13 is rendered OFF.

In response to the high-level signal output from the voltage comparison circuit 14, the transistor 33 of the alarm circuit 30 is rendered ON, so that the LED 32 is lit to visually indicate an alarm. It should be noted that the alarm circuit 30 is not limited to the one that visually outputs an alarm but it may be configured to audibly output an alarm.

Figure 3:
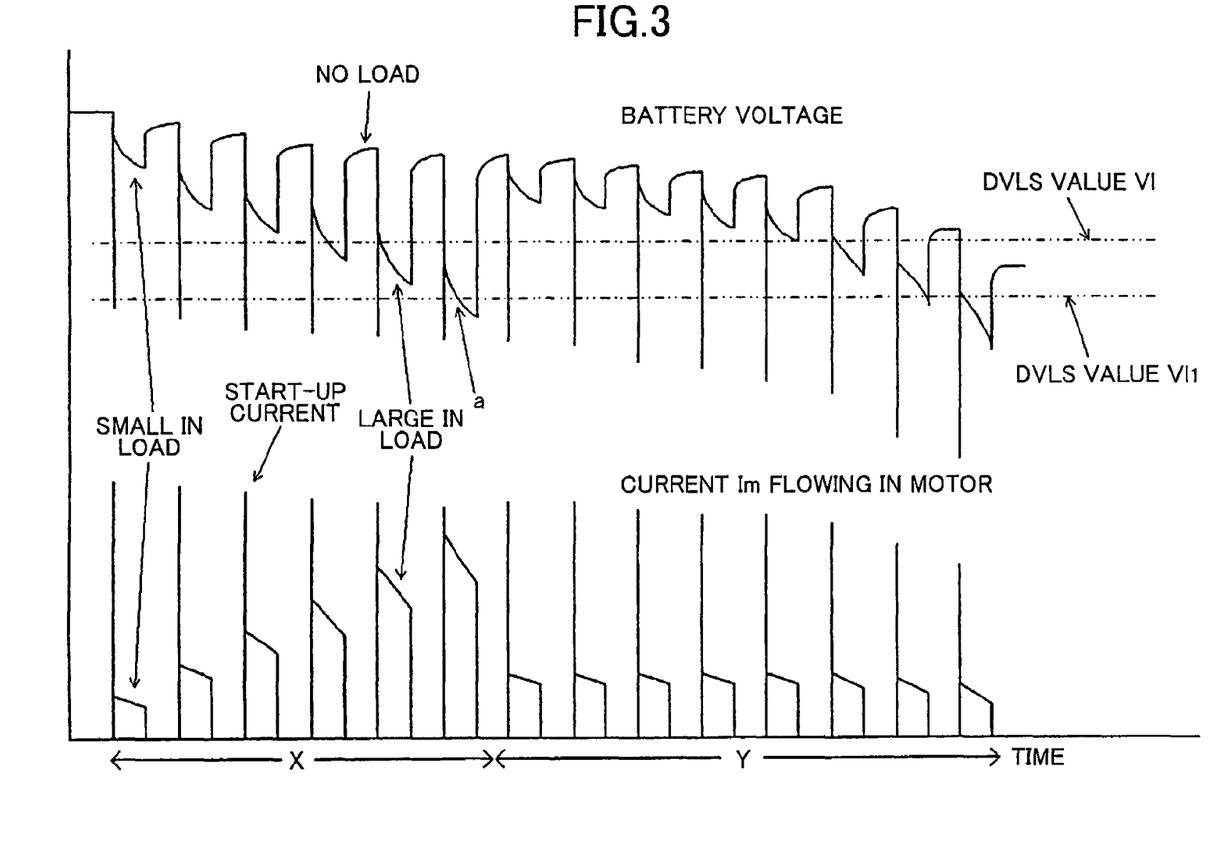
FIG. 3 is a graphical representation showing a battery voltage and a current flowing in a motor when the battery-powered tool is in use.

FIG. 3 shows a change in a battery voltage V1 and in a current Im flowing in the motor 2. The battery pack 9 is in a full-charge condition at the start of use. Screw tightening or drilling operations are performed using the full-charge battery pack 9 until the residual amount of charges in the battery pack 9 is zeroed. During the first half of the entire operation indicated by X in FIG. 3, the load imposed on the tool changes greatly through such operations as to drilling into different kinds of workpieces. During the second half of the entire operation indicated by Y in FIG. 3, the load imposed on the tool is maintained as constant as possible by performing such operations as to drilling into the same kind of workpieces.

As can be seen from FIG. 3, with a conventional discharge voltage limiter that constantly checks the battery voltage, the FET 13 is undesirably rendered OFF due to the battery voltage falling below the discharge voltage limiter set value V11 (hereinafter referred to as DVLS value V11) indicated at a point "a" in FIG. 3. Despite the fact that there remains charges in the battery pack, the battery voltage falls below the DVLS value V11 at the time when the tool is momentously imposed on a heavy load or at the time of start-up of the motor 12.

In this embodiment, the battery voltage is checked when no load is imposed on the tool, that is, when the main switch 4 is turned OFF, in order that the FET 13 may normally be rendered OFF when the battery voltage falls below a predetermined value.

Figure 4:
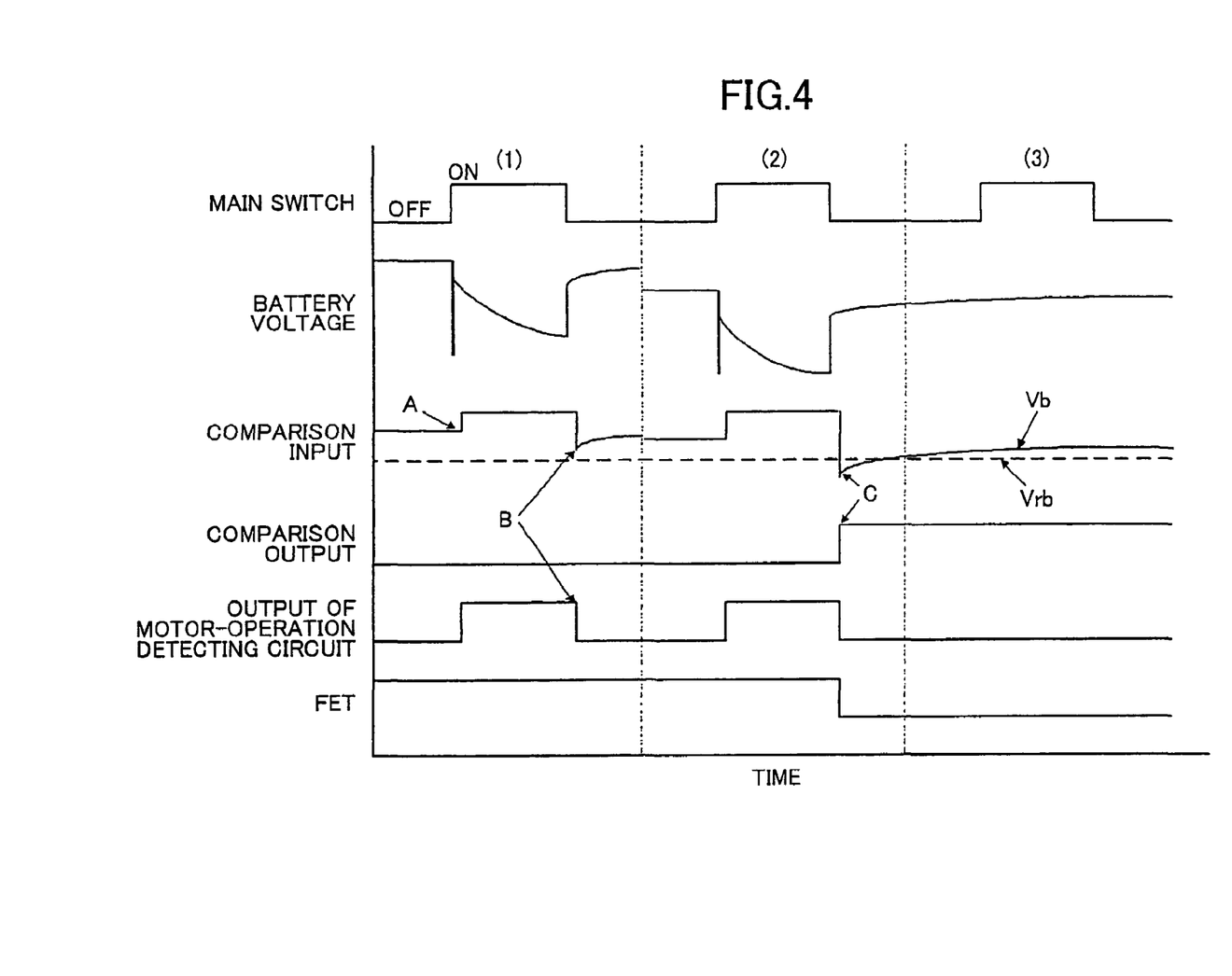
FIG. 4 is a timing chart for illustrating operation of the battery-powered tool according to the embodiment of the invention.

FIG. 4 is a timing chart for illustrating operations of various components of the circuit shown in FIG. 2. Operation during a first part (1) is performed with the use of a full-charge battery pack 9. When the main switch 4 is turned ON, the motor 2 is driven, with the result that the battery voltage is abruptly lowered. However, the capacitor 148 connected to the inverting input terminal of the operational amplifier 150 prevents the battery voltage Vb from lowering abruptly. See point "A". As a result, the battery voltage Vb does not fall below the reference battery voltage Vrb. Thereafter, the output of the motor-operation detecting circuit 17, that is connected to the inverting input terminal of the operational amplifier 150, is turned to a high-level, so that the battery voltage Vb exceeds the reference battery voltage Vrb regardless of the load imposed on the battery pack 9. Consequently, the output of the operational amplifier 150 is maintained at the low-level. Subsequently, when the main switch 4 is rendered OFF, the output of the operational amplifier 180 is turned to a low-level when the battery voltage is restored to some extent due to time constant determined by the capacitor 178 and the resistor 172. The voltage comparison circuit 14 thus performs comparison of the battery voltage Vb with the reference battery voltage Vrb. See point "B". Because the operation during the period (1) is performed with the use of a full-charge battery pack, the output of the voltage comparison circuit 14 is maintained at a low-level, not causing the FET 13 to be rendered OFF.

The operation performed during the period (2) uses a battery pack with a small amount of residual capacity. The battery voltage drops greatly when a load is imposed on the battery pack 9, and the recovery of the voltage is delayed. As a result, a high-level output is obtained from the voltage comparison circuit 14 because the battery voltage Vb is below the reference battery voltage Vrb. See point "C". As such, the transistor 33 of the alarm circuit 30 is rendered ON, thereby lighting the LED 32. Once the output of the voltage comparison circuit 14 is turned to a high-level, the reference battery voltage Vrb is maintained at the high-level due to the operation of the diode 147. Even if the battery voltage is thereafter recovered to the originally set reference value by the resistors 143 and 144, the high-level condition is maintained.

As can be seen from the operation performed during a period (3), the reference motor voltage Vrm of the motor-operation detecting circuit 17 applied from the output of the voltage comparison circuit 14 through the diode 175 is also at the high-level. The output of the motor-operation detecting circuit 17, that is connected to the inverting input terminal of the voltage comparison circuit 14, is maintained at the low-level when the main switch 4 is again turned ON. Consequently, the output of the voltage comparison circuit 14 continuously performs a self-holding operation to hold the high-level. As such, once the voltage comparison circuit 14 detects that the battery voltage has lowered from the set value, the FET 13 does not turned ON again and the LED 32 is continuously lit even if the battery voltage is recovered.

Although the present invention has been described with respect to a specific embodiment, it will be appreciated by one skilled in the art that a variety of changes may be made without departing from the scope of the invention. For example, in the above-described embodiment, the output of the voltage comparison circuit 14 is forcibly maintained at the low-level, that is, the comparison operation of the voltage comparison circuit 14 is disabled or invalidated, by outputting a high-level signal from the motor-operation detecting circuit 17 when the latter circuit 17 detects that the motor 2 is in operation. However, a circuit configuration may be modified so that the output of the voltage comparison circuit 14 is disabled by the detection output of the motor-operation detecting circuit 17, thereby rendering the transistor 152 ON.

Figure 5:
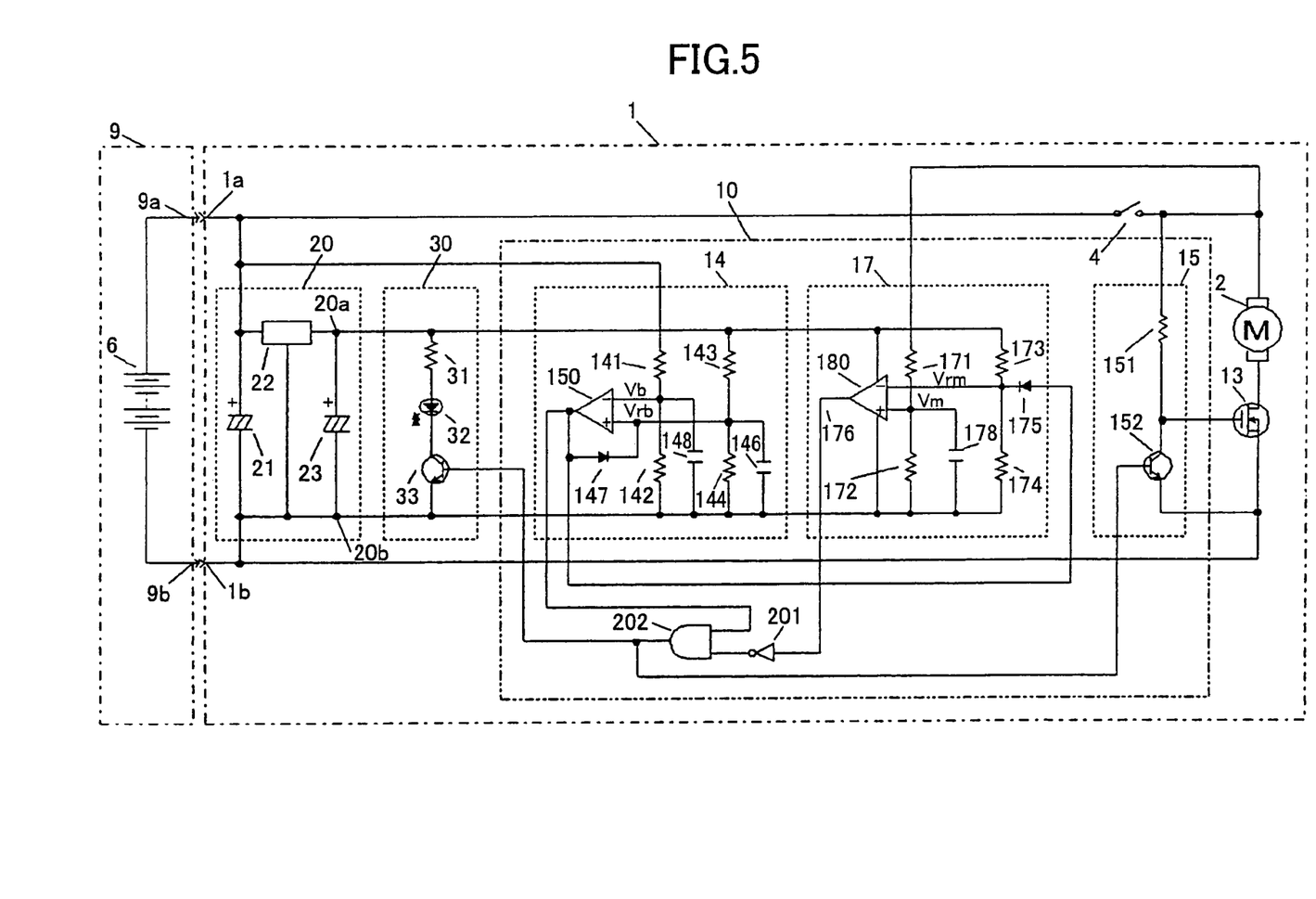
FIG. 5 is a circuit diagram showing a battery-powered tool according to another embodiment of the invention.

FIG. 5 shows a modification as described above. The output terminal of the motor-operation detecting circuit 17, that is, the output terminal of the operational amplifier 180 is connected through an inverter 201 to one input terminal of an AND gate 202. The output terminal of the voltage comparison circuit 14, that is, the output terminal of the operational amplifier 150, is connected to another input terminal of the AND gate 202. As a result, during detection of the motor operation by the motor-operation detecting circuit 17, the AND gate 202 is not enabled regardless of the output of the voltage comparison circuit 14, so that the transistor 152 is not rendered ON.

What is claimed is:
1. A battery-powered tool comprising:
a regulated power supply that supplies a fixed voltage;
a motor driven by a battery pack, the battery pack generating a voltage that changes depending on a residual amount of charges in the battery pack and a load imposed on the motor;
a main switch connected between the battery pack and the motor;
a switching element connected in series with the motor, the battery pack and the main switch;
a first voltage comparison circuit having a first input terminal applied with a first detection voltage indicative of a voltage of the battery pack, a second input terminal applied with a first reference voltage, and a first output terminal, the first voltage comparison circuit comparing the first detection voltage with the first reference voltage and selectively outputting one of a first signal and a second signal to the first output terminal, the first signal being output when the first detection voltage is above the first reference voltage and the second signal being output when the first detection voltage falls below the first reference voltage, wherein the switching element is rendered ON in response to the first signal whereas the switching element is rendered OFF in response to the second signal; and
a motor-operation detecting circuit that detects a driving status of the motor and outputs a third signal when the motor is driven and a fourth signal when the motor is not driven,
wherein the first voltage comparison circuit does not output the second signal when the third signal is output from the motor-operation detecting circuit.

2. The battery-powered tool according to claim 1, further comprising an alarm circuit that alerts a user that the voltage of the battery pack has been lowered in response to the second signal output from the first voltage comparison circuit.

3. The battery-powered tool according to claim 2, wherein the third signal invalidates the first detection voltage and is applied to the first input terminal of the first voltage comparison circuit, thereby causing the first voltage comparison circuit to output the first signal regardless of whether the first detection voltage is above or falls below the first reference voltage.

4. The battery-powered tool according to claim 3, wherein the motor-operation detecting circuit comprises a gate that allows the third signal to be applied to the first input terminal of the first voltage comparison circuit and does not allow the fourth signal to be applied to the first input terminal of the first voltage comparison circuit.

5. The battery-powered tool according to claim 3, wherein when the motor-operation detecting circuit outputs the fourth signal, the first voltage comparison circuit selectively outputs one of the first signal and the second signal depending upon whether the first detection voltage is above or falls below the first reference voltage.

6. The battery-powered tool according to claim 5, further comprising a self-holding circuit that holds the second signal output from the first voltage comparison circuit once the first detection voltage falls below the first reference voltage.

7. The battery-powered tool according to claim 6, wherein the self-holding circuit comprises a diode connected between the first output terminal and the second input terminal of the first voltage comparison circuit, the diode applying a voltage higher than the first reference voltage to the second input terminal.

8. The battery-powered tool according to claim 2, wherein the first voltage comparison circuit comprises an AND gate having one input terminal connected to the first output terminal of the first voltage comparison circuit and another input terminal connected to the output of the motor-operation detecting circuit, wherein the AND gate is enabled and the second signal is allowed to pass therethrough and applied to the alarm circuit when the fourth signal is output from the motor-operation detection circuit.

9. The battery-powered tool according to claim 2, further comprising a first resistor, a second resistor, and a first capacitor, the first resistor and the second resistor being connected in series across the battery pack, the first capacitor being connected in parallel with the second resistor, wherein a voltage developed across the second resistor is applied as the first detection voltage to the first input terminal of the first voltage comparison circuit.

10. The battery-powered tool according to claim 9, further comprising a third resistor, a fourth resistor, and a second capacitor, the third resistor and the fourth resistor being connected in series across the regulated power supply, the second capacitor being connected in parallel with the fourth resistor, wherein a voltage developed across the fourth resistor is applied as the first reference voltage to the second input terminal of the first voltage comparison circuit.

11. The battery-powered tool according to claim 10, wherein the motor-operation detecting circuit comprises a second voltage comparison circuit having a third input terminal applied with a second detection voltage indicative of a voltage applied to the motor, a fourth input terminal applied with a second reference voltage, and a second output terminal, the second voltage comparison circuit comparing the second detection voltage with the second reference voltage and selectively outputting one of the third signal and the fourth signal to the second output terminal.

12. The battery-powered tool according to claim 11, further comprising a fifth resistor, a sixth resistor, and a third capacitor, the fifth resistor and the sixth resistor being connected in series across the motor, the third capacitor being connected in parallel to the sixth resistor, wherein a voltage developed across the sixth resistor is applied as the detection voltage to the third input terminal of the second voltage comparison circuit.

13. The battery-powered tool according to claim 12, further comprising a seventh resistor and an eighth resistor being connected in series across the regulated power supply, wherein a voltage developed across the eighth resistor is applied as the second reference voltage to the fourth input terminal of the second voltage comparison circuit.

* * * * *